(12) United States Patent
Mueller et al.

(10) Patent No.: US 6,420,908 B2
(45) Date of Patent: *Jul. 16, 2002

(54) SENSE AMPLIFIER

(75) Inventors: Gerhard Mueller, Wappingers Falls, NY (US); Heinz Hoenigschmid, Starnberg (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,665

(22) Filed: Jan. 5, 1999

(51) Int. Cl.$^7$ .............................................. G01R 19/00
(52) U.S. Cl. .......................................... 327/51; 327/57
(58) Field of Search .............................. 327/55, 57, 51, 327/52, 54, 56; 365/205, 207, 208, 154, 189.05, 189.09, 230.08

(56) References Cited

U.S. PATENT DOCUMENTS

| | | | | |
|---|---|---|---|---|
| 4,150,311 A | * | 4/1979 | Matsuda et al. .............. 327/57 |
| 4,421,996 A | * | 12/1983 | Chuang et al. ................ 327/57 |
| 4,816,706 A | * | 3/1989 | Dhong et al. .................. 327/57 |
| 5,051,959 A | * | 9/1991 | Nakano et al. ......... 365/230.06 |
| 5,075,571 A | * | 12/1991 | Dhong et al. ............... 327/390 |
| 5,093,808 A | * | 3/1992 | Foss ........................... 365/203 |
| 5,130,580 A | * | 7/1992 | Min et al. ..................... 327/57 |
| 5,265,047 A | * | 11/1993 | Leung et al. ............... 365/154 |
| 5,566,105 A | * | 10/1996 | Tanaka et al. ......... 365/185.22 |
| 5,638,333 A | * | 6/1997 | Lee .............................. 327/51 |
| 5,680,349 A | * | 10/1997 | Atsumi et al. .............. 326/108 |
| 5,856,945 A | * | 1/1999 | Lee et al. ................. 365/185.3 |
| 5,933,386 A | * | 8/1999 | Walker et al. ......... 365/230.01 |
| 5,949,720 A | * | 9/1999 | Brady .................... 365/189.06 |
| 6,021,083 A | * | 1/2000 | Shiau et al. ........... 365/230.01 |
| 6,088,275 A | * | 7/2000 | Tanaka ....................... 365/205 |

FOREIGN PATENT DOCUMENTS

JP          09 213078          8/1997

* cited by examiner

*Primary Examiner*—Matthew Smith
*Assistant Examiner*—Paul Dinh
(74) *Attorney, Agent, or Firm*—Stanton Braden

(57) ABSTRACT

Providing an active signal that increases the gate overdrive voltage of the driver of a sense amplifier enables the use of smaller drivers. This facilitates more efficient layouts and/or smaller sense amplifiers, thereby reducing the chip size.

32 Claims, 2 Drawing Sheets

US 6,420,908 B2

1

SENSE AMPLIFIER

FIELD OF THE INVENTION

The present invention relates generally to semiconductor integrated circuits (ICs). In particular, the invention relates to reducing the size of sense amplifiers used in ICs such as memory ICs.

BACKGROUND OF THE INVENTION

Semiconductor ICs, such as memory ICs, employ sense amplifiers, for example, to read, write, and restore information in the memory cells. A sense amplifier is provided for a bitline pair of the memory IC. During operation, the sense amplifier senses and amplifies a differential voltage between the bitlines of the bitline pair. The differential voltage indicates whether the charge stored in the selected memory cell is a logic 1 or logic 0.

A continuing demand for higher integration and lower manufacturing cost has placed increasing pressures on IC manufacturers to produce smaller and smaller chips. Since the sense amplifiers, in a typical memory IC, contribute to about 10% of the chip size, decreasing the size of a sense amplifier can provide a noticeable reduction in the overall chip size.

Generally, a sense amplifier includes cross-coupled latches for sensing the differential voltage between the bitline pair. The sense amplifier also includes drivers for driving the latches in order to amplify the sensed differential voltage. The drivers are relatively large and contribute significantly to the size of the sense amplifier.

Reducing the size of the drivers can noticeably reduce the size of the sense amplifier. However, the drivers require a minimum dimension due to design requirements. Reducing the size of the drivers to smaller than the minimum dimension can result in a decrease in the performance of the drivers, which adversely impacts the performance or the functionality of the IC.

One technique of reducing the size of the sense amplifier is to locate the drivers outside of the general sense amplifier region. For example, the drivers can be located in the stitch gap region between sense amplifiers of a stitched wordline architecture or in the local wordline driver region between the sense amplifiers in a segmented wordline architecture. Other areas in which the drivers can be located include the row decoder region. However, smaller groundrules have decreased the surface area of the stitch gap or local wordline driver region, making it difficult to accommodate the drivers.

As evidenced from the foregoing discussion, it is desirable to decrease the size of sense amplifiers without decreasing their performance or affecting their functionality.

SUMMARY OF THE INVENTION

The invention relates to reducing the size of sense amplifiers. In one embodiment, an active input signal which activates the driver of the sense amplifier produces an increase in the overdrive voltage to cause the driver to operate in the increased overdrive mode. This enables the use of a smaller driver which facilitates a more efficient layout and/or reduces the size of the sense amplifiers.

DETAILED DESCRIPTION OF THE INVENTION

Sense amplifiers are employed in semiconductor ICs such as, for example, random access memories (RAMs) including dynamic RAMs (DRAMs), high speed DRAMs such as Rambus DRAMs and SLDRAMs, ferroelectric RAMs (FRAMs), synchronous DRAMs (SDRAMs), or merged DRAM-logic chips (embedded DRAMs). Other types of memory ICs or logic ICs can also use sense amplifiers.

Figure 1:
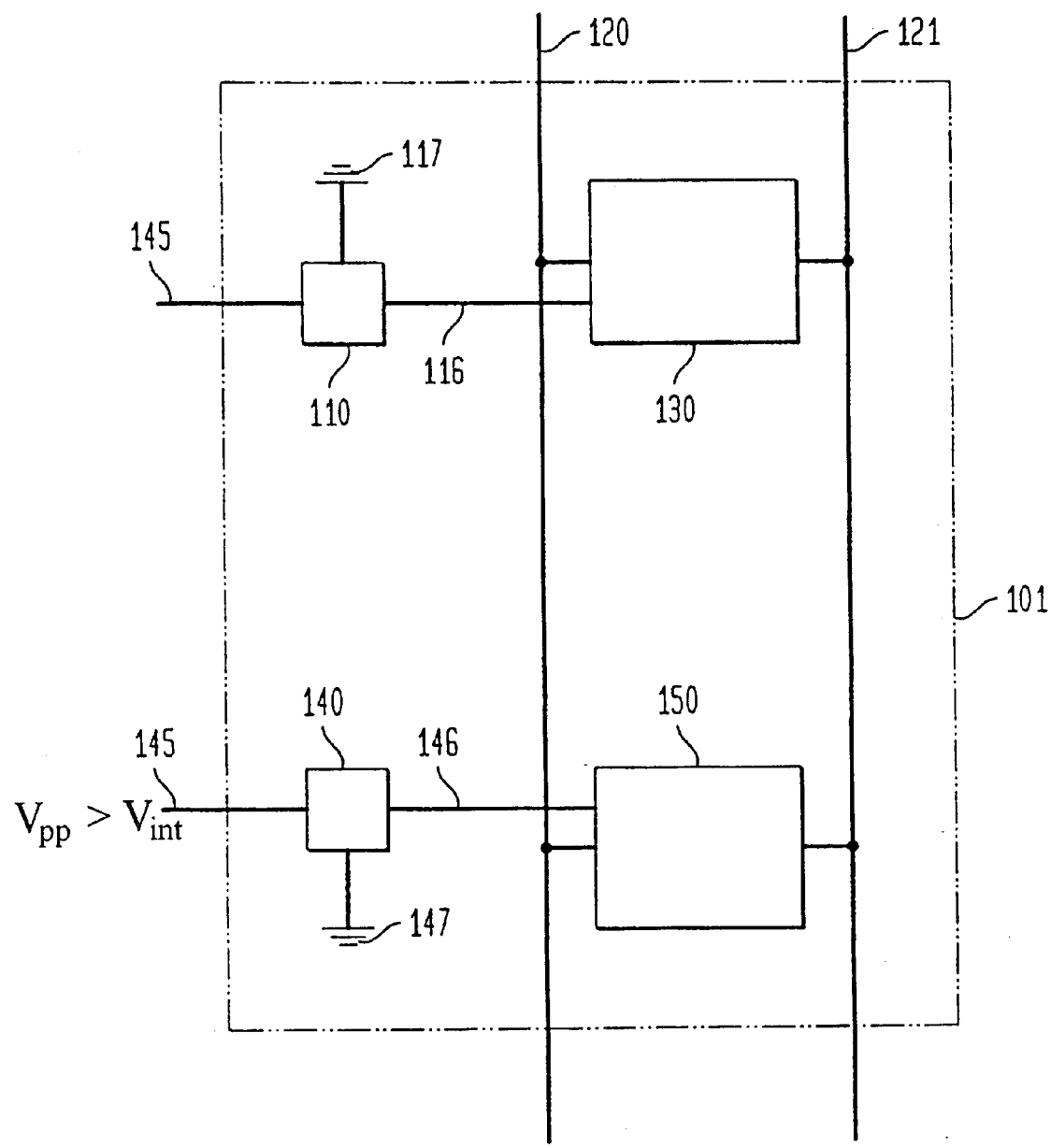
FIG. 1 shows a block diagram of one of the invention.

Referring to FIG. 1, a sense amplifier 101 in accordance with one embodiment of the invention is shown. The sense amplifier is coupled to bitlines 120 and 121. The bitline containing the selected cell is typically referred to as the "bitline true" and the other is referred to as the "bitline complement".

In general, an equalization circuit (not shown) equalizes the bitlines before a memory access. The bitlines are equalized to a voltage equal to about $V_{bleq}$. Typically, $V_{bleq}$ is equal to about $V_{blh}/2$, where $V_{blh}$ is the upper voltage value of the bitlines. After the bitlines have been equalized, a cell is selected from one of the bitlines of the bitline pair. The charge stored in the selected memory cell affects the voltage level of the bitline true positively or negatively while the voltage level on the bitline complement remains at $V_{blh}/2$. The difference between the bitline true and bitline complement is then amplified.

The sense amplifier comprises p-latch 130 and n-latch 150 that are coupled to the bitlines of the bitline pair. The p-latch senses a differential voltage between bitlines 120 and 121. If a positive differential voltage is sensed, the p-latch couples the bitline true to a p-driver 110 while the bitline complement is isolated from the p-driver. A negative differential voltage between bitlines 120 and 121 causes the p-latch to couple the bitline complement to the p-driver and to isolate the bitline true from the p-driver. As for the n-latch, the bitline complement is coupled to an n-driver 140 while isolating the bitline true from the n-driver when a positive differential voltage exists on the bitline pair. If a negative differential voltage is sensed, the n-latch couples the bitline to the n-driver and de-couples the bitline complement from the n-driver.

The p-driver 110 comprises an input 115 and an output 116 coupled to the p-latch. An active p-driver input signal at input 115 activates the p-driver, causing it to charge the load connected to its output to a voltage equal to about the voltage on an upper power rail 117. The upper power rail comprises a voltage equal to about $V_{blh}$. $V_{blh}$ is, for example, about 1.6V. In one embodiment, the p-driver input signal is an active low signal.

The n-driver 140 comprises an input 145 and an output 146 coupled to the n-latch. An active n-driver input signal at input 145 activates the n-driver, causing it to charge the load connected to its output to a value equal to a voltage on a lower power rail 147. The lower power rail comprises, typically, a voltage equal to ground. In one embodiment, the n-driver input signal is an active high signal.

The concept of driving the cross-coupled latches in the sense amplifier with a driver is well established. See, for example, Lu et al., IEEE Journal of Solid State Circuits, Vol. SC-19, No. 4, August 1984, p. 451–454, which is herein incorporated by reference for all purposes. The signals that control the operation of the NSET and the PFET driver are referred to as "clocks to control the sense amplifier latching."

The p-driver and n-driver typically drive a plurality of sense amplifiers. To satisfy the driving requirements, relatively large drivers are needed. These large drivers can contribute significantly to the size of the sense amplifiers.

In accordance with the invention, the drivers are configured to operate in an increased overdrive mode. The increased overdrive mode is achieved by providing the drivers with active input signals that produce an increase in the magnitude of the drivers' overdrive voltage. Increasing the overdrive voltage boosts the performance of the drivers, enabling the use of smaller drivers to achieve the same performance. As the drivers significantly contribute to the size of the chip, a noticeable reduction in sense amplifier size is achieved with the invention.

In one embodiment, the p-driver operates in an increased overdrive mode by providing an active low p-driver input signal that produces an increase in the overdrive voltage of the p-driver. The active low p-driver input signal comprises a negative signal with respect to ground. In one embodiment, the active low p-driver input signal is equal to about −0.2 to −1.0V. In another embodiment, the active low driver input signal is about −0.5V. Preferably, the active low driver signal is equal to about a negative wordline low voltage. The negative wordline voltage is, for example, about −0.5V. The use of a negative wordline voltage advantageously provides a negative voltage source to operate the driver in the increased overdrive mode without requiring additional voltage source. Other negative voltages like an existing negative bias voltage for a well (such as the array well or array back bias voltage) can also be useful to serve as the active low p-driver input signal, depending on design requirements and limitations.

In one embodiment, the active high n-driver input signal is provided which increases the n-driver overdrive voltage. The active high n-driver input signal comprises a signal which is greater than $V_{int}$, where $V_{int}$ is the upper power source for the circuits of the IC. $V_{int}$ is, for example, equal to about 1.5V–3V. In one embodiment, $V_{int}$ is equal to about 2.2V. In one embodiment, active high n-driver signal is equal to about $V_{pp}$, where $V_{pp}$ is the boosted voltage of the wordline, which typically is about 3.5V. Other voltage levels that are greater than $V_{int}$ can also be useful.

Figure 2:
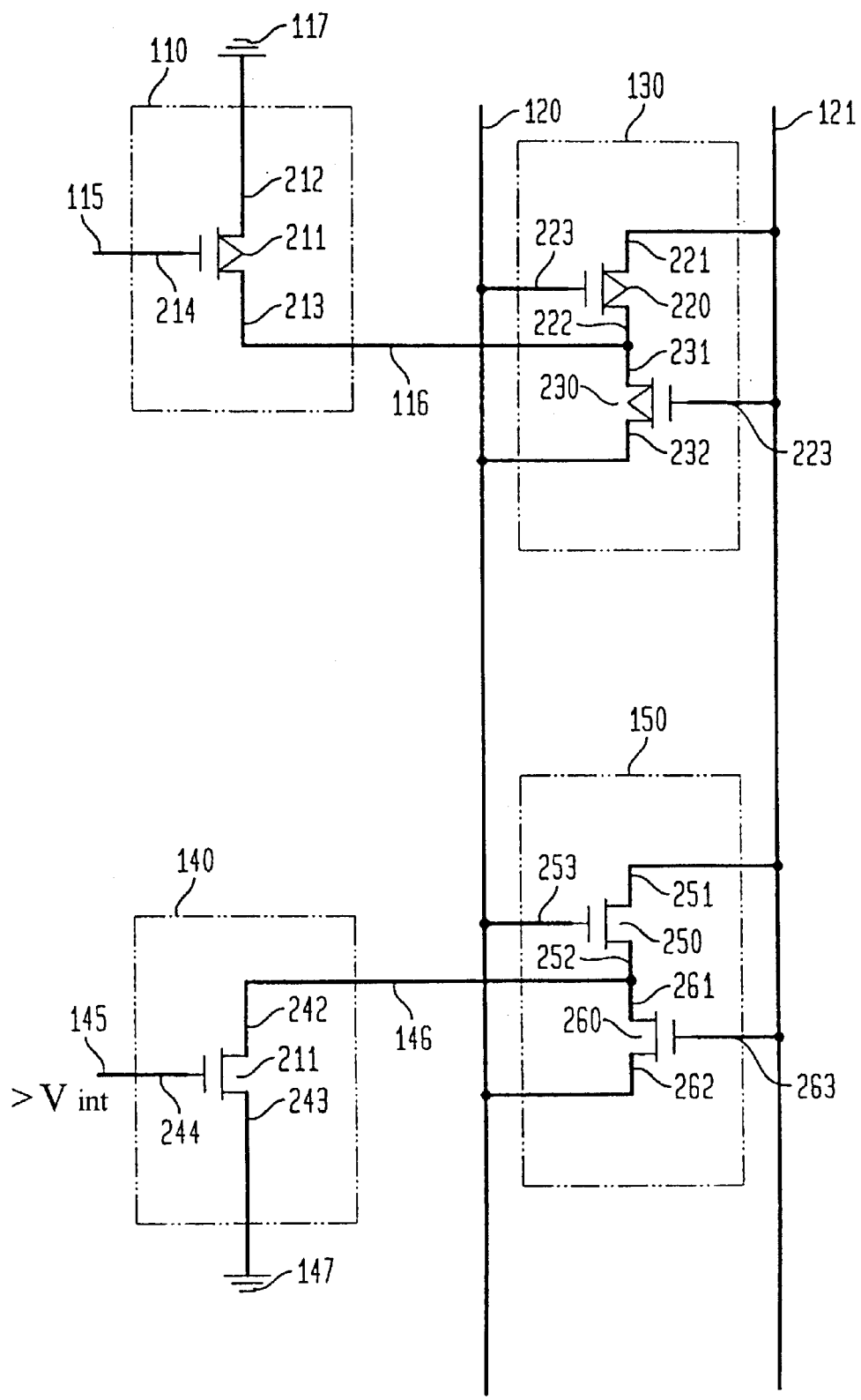
FIG. 2 shows an embodiment of the invention.

FIG. 2 shows one embodiment of the invention. As shown, the sense amplifier includes a cross-coupled p-latch 130 having first and second transistors 220 and 230. The transistors, in one embodiment, are p-FETs. The first transistor comprises a first terminal 221, a second terminal 222, and a gate 223. Likewise, the second transistor comprises a first terminal 231, a second terminal 232, and a gate 233. The second terminal of the first transistor is coupled to the first terminal of the second transistor. The gate terminal 223 and the first terminal 221 of the first transistor are respectively coupled to one bitline 120 and the other bitline 121. The second terminal of the second transistor is coupled to one bitline 120; the gate terminal 233 is coupled to the other bitline 121.

A p-driver 110 comprising an input 115 and an output 116 coupled to the common terminals of the first and the second transistors of the p-latch is provided. The p-driver includes a driver transistor 211 having a first terminal 212, a second terminal 213, and a gate 214. In one embodiment, the driver transistor comprises a p-FET. The first terminal is coupled to an upper voltage source 117, and the second terminal is coupled to the output.

The upper voltage source is equal to about $V_{blh}$. Providing an active signal at the gate causes the driver transistor to be conductive, coupling the upper voltage source to the output. In one embodiment, the active signal is a logic 0.

In operation, the cross-coupled p-latch senses a difference on the bitlines 120 and 121. Initially, the bitlines are equalized to $V_{bleq}$. A memory cell is then selected from one of the bitlines (bitline true) within the bitline pair. The charge stored in the capacitor of the selected memory cell is then coupled to the bitline. Depending on whether the charge represents a logic 1 or logic 0, the bitline true is either pulled up or down. For example, the bitline true is pulled up or down about ±0.15V, resulting in the bitline true being about $V_{bleq}$±0.15. The bitline complement remains at $V_{bleq}$.

In one embodiment of the invention, a negative differential voltage between the bitline pair indicates that the selected memory cell contains a logic 0. This causes one of the p-latch transistors to form a conductive path between the p-driver and the bitline complement, and the other p-latch transistor to isolate the bitline true from the p-driver. A positive differential between the bitline pair, on the other hand, indicates that the selected memory cell contains a logic 1. This causes the p-latch to connect the bitline to the p-driver and to isolate the bitline complement from the p-driver. An active p-driver input signal activates the p-driver, charging the bitline to which its output is connected to a voltage level of about $V_{blh}$.

In accordance with one embodiment of the invention, an active low p-driver signal which produces an increase in magnitude of the overdrive voltage is provided. The overdrive voltage is the difference between the gate source voltage and the threshold voltage of the driver transistor. The active low p-driver input signal comprises a negative signal with respect to ground. In one embodiment, the active low p-driver input signal is equal to about −0.2–1.0V. Preferably, the active low driver signal is equal to about a negative wordline voltage or a negative well bias voltage. Typically, the negative wordline voltage is about −0.5V. Other negative voltages can also be useful to serve as the active low p-driver input signal, depending on design requirements and limitations.

In the case where $V_{blh}$ is about 1.6V, $V_{bleq}$ is about 0.8V, and the gate threshold voltage of the driver transistor is about 0.7V, activating the p-driver with a conventional active low signal equal to ground produces an overdrive voltage $|(V_{GS}-V_T)|$ of about 0.9V. However, activating the p-driver with a negative active low signal of about, for example, −0.5V in accordance with one embodiment of the invention produces an overdrive voltage of about 1.4V.

Due to the increase of the gate overdrive voltage, the width of the driver transistor can be reduced accordingly, giving rise to a significantly more compact core circuit layout. Since the core circuits such as the sense amplifiers have to be laid out on pitch, this can lead to a substantial decrease in chip size. This advantageously results in an increase in the number of chips per wafer, leading to a reduction in the cost per chip.

The sense amplifier also includes a cross-coupled n-latch 150. The n-latch comprises first and second transistors 250 and 260 which, for example, are n-FETs. The first transistor comprises a first terminal 251, a second terminal 252, and a gate 253; the second transistor comprises a first terminal 261, a second terminal 262, and a gate 263. The transistors are configured, with the second terminal of the first transistor connected to the first terminal of the second transistor. The gate terminal 253 and the first terminal 251 of the first transistor are respectively coupled to one bitline 120 and the other bitline 121. The second terminal of the second transistor is coupled to one bitline 120, and the gate terminal 263 is coupled to the other bitline 121.

An n-driver 140 comprising an input 145 and an output 146 is provided. The common terminals of the transistors in the n-latch serve as an input for receiving the output of the n-driver. The n-driver includes a driver transistor 211 having a first terminal 242, a second terminal 243, and a gate 244. The driver transistor comprises, for example, an n-FET. The first terminal is coupled to the output, and the second terminal is coupled to a lower power rail 147. The lower power rail typically comprises a voltage equal to about ground. Providing an active signal at the gate causes the driver transistor to be conductive, coupling the lower voltage source to the output. In one embodiment, the active signal is a logic 1 signal.

In operation, the n-latch senses a difference on the bitlines 120 and 121. In one embodiment, a negative differential voltage between the bitlines of the bitline pair indicates that the selected memory cell contains a charge representing a logic 0. In this case, the appropriate n-latch transistor is switched on to connect the bitline true to the n-driver and the other n-latch transistor is switched off to isolate the bitline complement from the n-driver.

When a positive differential voltage exists between the bitlines of the bitline pair, the selected memory cell contains a charge representing logic 1. This causes the n-latch to connect the bitline complement to the n-driver and isolate the bitline true from the n-driver by switching the appropriate n-latch transistors on and off. An active n-driver input signal activates the n-driver, causing it to discharge the bitline to which its output is connected to about ground.

In accordance with one embodiment of the invention, an active high n-driver input driver signal that increases the overdrive voltage to operate the n-driver in the increased overdrive mode is provided. The active high n-driver input signal comprises a signal which is greater the $V_{int}$, where $V_{int}$ is the upper power source for the circuits of the IC. Typically, $V_{int}$ is equal to about 2.1V. In one embodiment, the active high driver input signal is equal to about $V_{pp}$ which typically is about 3.5V. Other voltage levels that are greater than $V_{int}$ can also be useful, depending on design requirements and limitations.

In the case where $V_{int}$ is about 2.1V and the gate threshold voltage of the driver transistor is about 0.6V, activating the n-driver with a conventional active high signal equal to $V_{int}$ produces an overdrive voltage ($V_{GS}-V_T$) of about 1.5V. However, activating the n-driver with an active high signal equal to $V_{pp}$ (about 3.5V) in accordance with one embodiment of the invention produces an overdrive voltage of about 2.9V.

A boost in the driver performance is achieved by increasing the overdrive voltage of the driver. This can lead to a reduction of the driver transistor size of, for example, about 50%. The reduction in the size of the driver transistors enables a more efficient layout, resulting in smaller chip size. For example, the smaller drivers can be located in the narrow stitch gap or local wordline driver regions. Alternatively, the drivers can be distributed throughout the sense amplifier bank, as disclosed in U.S. Pat. No. 5,831,912 to Mueller et al., which is herein incorporated by reference for all purposes. Although this increases the size of the sense amplifiers, the smaller drivers reduce the area penalty as compared to the use of conventional drivers in the sense amplifiers.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A sense amplifier comprising:
a first latch coupled to first and second bitlines;
a first reference voltage; and
a first driver circuit, the first driver circuit coupled to the first reference voltage and the latch via an output terminal, the first driver circuit is activated by receiving an active low input signal at an input terminal, wherein the active low input signal comprises a negative voltage to cause the first driver circuit to operate in an increased overdrive mode to drive one of the bitlines to about the reference voltage.

2. The sense amplifier of claim 1 wherein:
the first latch is a p-latch;
the first reference voltage comprises an upper power rail; and
the first driver is a p-driver.

3. The sense amplifier of claim 2 wherein the p-driver comprises a p-FET driver transistor having a gate and first and second terminals, the first terminal is coupled to the upper power rail, the second terminal is coupled to the output terminal, and the gate is coupled to the input terminal.

4. The sense amplifier of claim 3 wherein the active low signal is between about –0.2 to –1.0V.

5. The sense amplifier of claim 3 wherein the active low signal comprises a negative wordline low voltage.

6. The sense amplifier off claim 1 wherein the driver circuit comprises a p-FET driver transistor having a gate and first and second terminals, the first terminal is coupled to the first reference voltage, the second terminal is coupled to the output terminal, and the gate is coupled to the input terminal.

7. The sense amplifier of claim 6 wherein the active low signal is between about –0.2 to –1.0V.

8. The sense amplifier of claim 6 wherein the active low signal comprises a negative wordline low voltage.

9. The sense amplifier of claim 1 wherein the active low signal is between about –0.2 to –1.0V.

10. The sense amplifier of claim 1 wherein the active low signal comprises a negative wordline low voltage.

11. The sense amplifier of claims 1, 2, 3, 4, 5, 6, 7, 8, 9, or 10 further comprises:
a second latch;
a second reference voltage; and
a second driver circuit coupled to the second reference voltage and the second latch via an output terminal of the second driver circuit, the second driver circuit is activated by receiving an active high input signal at an input terminal of the second driver circuit, wherein the active high signal comprises a voltage greater than $V_{int}$ to cause the second driver circuit to operate in increased overdrive mode to drive one of the bitlines to about the reference voltage.

12. The sense amplifier of claim 11 wherein:
the second latch is an n-latch;
the second reference voltage comprises a lower power rail; and
the second driver is an n-driver.

13. The sense amplifier of claim 12 wherein the driver circuit comprises an n-FET driver transistor having a gate and first and second terminals, the first terminal is coupled to the lower power rail, the second terminal is coupled to the output terminal, and the gate is coupled to the input terminal.

14. The sense amplifier of claim 13 wherein the active high signal comprises a boosted voltage $V_{pp}$.

15. The sense amplifier of claim 11 wherein the second driver circuit comprises an n-FET driver transistor having a gate and first and second terminals, the first terminal is coupled to the second reference voltage, the second terminal is coupled to the output terminal, and the gate is coupled to the input terminal.

16. The sense amplifier of claim 15 wherein the active high signal comprises a boosted voltage $V_{pp}$.

17. The sense amplifier of claim 15 wherein the second reference voltage comprises a lower power rail.

18. The sense amplifier of claim 17 wherein the active high signal comprises a boosted voltage $V_{pp}$.

19. The sense amplifier of claim 11 wherein the second reference voltage comprises a lower power rail.

20. The sense amplifier of claim 19 wherein the active high signal comprises a boosted voltage $V_{pp}$.

21. The sense amplifier of claim 11 wherein the active high signal comprises a boosted voltage $V_{pp}$.

22. A sense amplifier comprising:

a latch for sensing a differential voltage between a pair of bitlines;

a reference voltage;

a driver circuit coupled to the reference voltage and the latch via an output terminal of the driver circuit, the driver circuit activated by receiving an active high input signal at an input terminal of the driver circuit; and wherein the active high signal comprises a voltage greater than a power source voltage $V_{int}$ to cause the driver circuit to operate in increased overdrive mode to drive one of the bitlines to about the reference voltage.

23. The sense amplifier of claim 22 wherein:

the latch is an n-latch;

the reference voltage comprises a lower power rail; and the driver is an n-driver.

24. The sense amplifier of claim 23 wherein the driver comprises an n-FET driver transistor having a gate and first and second terminals, the first terminal is coupled to the reference voltage, the second terminal is coupled to the output terminal, and the gate is coupled to the input terminal.

25. The sense amplifier of claim 24 wherein the active high signal comprises a boosted voltage $V_{pp}$.

26. The sense amplifier of claim 22 wherein the driver circuit comprises an n-FET driver transistor having a gate and first and second terminals, the first terminal is coupled to the reference voltage, the second terminal is coupled to the output terminal, and the gate is coupled to the input terminal.

27. The sense amplifier of claim 26 wherein the active high signal comprises a boosted voltage $V_{pp}$.

28. The sense amplifier of claim 26 wherein the reference voltage comprises a lower power rail.

29. The sense amplifier of claim 28 wherein the active high signal comprises a boosted voltage $V_{pp}$.

30. The sense amplifier of claim 22 wherein the reference voltage comprises a lower power rail.

31. The sense amplifier of claim 30 wherein the active high signal comprises a boosted voltage $V_{pp}$.

32. The sense amplifier of claim 22 wherein the active high signal comprises a boosted voltage $V_{pp}$.

* * * * *